(12) United States Patent
Chan et al.

(10) Patent No.: US 9,659,796 B2
(45) Date of Patent: May 23, 2017

(54) RINSING WAFERS USING COMPOSITION-TUNABLE RINSE WATER IN CHEMICAL MECHANICAL POLISH

(75) Inventors: Cheng Hsun Chan, Shanhua Township (TW); Ming-Che Ho, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1323 days.

(21) Appl. No.: 12/179,347

(22) Filed: Jul. 24, 2008

(65) Prior Publication Data
US 2010/0018029 A1    Jan. 28, 2010

(51) Int. Cl.
*H01L 21/67* (2006.01)

(52) U.S. Cl.
CPC .. *H01L 21/67046* (2013.01); *H01L 21/67051* (2013.01); *Y10T 29/49002* (2015.01)

(58) Field of Classification Search
None
See application file for complete search history.

(56) References Cited

U.S. PATENT DOCUMENTS

| | | | |
|---|---|---|---|
| 5,175,124 A * | 12/1992 | Winebarger | H01L 21/02052 134/1.3 |
| 5,846,398 A | 12/1998 | Carpio | |
| 6,099,396 A | 8/2000 | Krone-Schmidt | |
| 6,436,302 B1 | 8/2002 | Li et al. | |
| 6,471,783 B1 * | 10/2002 | Gotoh et al. | 134/3 |
| 6,579,798 B2 | 6/2003 | Chatterjee et al. | |
| 6,638,868 B1 | 10/2003 | Shih et al. | |
| 6,726,535 B2 | 4/2004 | Shih et al. | |
| 7,087,564 B2 | 8/2006 | Misra et al. | |
| 7,297,670 B2 | 11/2007 | Misra et al. | |
| 2002/0023671 A1 * | 2/2002 | Mitsumori et al. | 134/151 |
| 2002/0107155 A1 * | 8/2002 | Miller et al. | 510/108 |
| 2002/0121286 A1 * | 9/2002 | Verhaverbeke et al. | 134/1.3 |
| 2003/0087524 A1 * | 5/2003 | Aoki et al. | 438/691 |
| 2003/0158630 A1 * | 8/2003 | Pham | G05D 11/132 700/285 |
| 2004/0226654 A1 * | 11/2004 | Hongo et al. | 156/345.11 |
| 2005/0223980 A1 * | 10/2005 | Awamura | G03F 7/30 118/708 |
| 2006/0115774 A1 | 6/2006 | Wang et al. | |
| 2007/0085989 A1 * | 4/2007 | Nagahashi et al. | 355/53 |
| 2007/0240734 A1 * | 10/2007 | Teng et al. | 134/1 |
| 2008/0203058 A1 * | 8/2008 | Harumoto et al. | 216/83 |

OTHER PUBLICATIONS

Chen, H.C., et al., "The Investigation of Galvanic Corrosion in Post-Copper-CMP Cleaning," Proceedings of the IEEE 2000 International Interconnect Technology Conference, 2000, IEEE, pp. 256-258.

\* cited by examiner

*Primary Examiner* — Lan Vinh
*Assistant Examiner* — Bradford Gates
(74) *Attorney, Agent, or Firm* — Slater Matsil, LLP

(57) ABSTRACT

An apparatus for manufacturing integrated circuits on a wafer includes a polish pad; a rinse arm movable over the polish pad; and a post-polish cleaner. The post-polish cleaner includes a brush for brushing the wafer; and a nozzle aiming at the wafer. The apparatus further includes a mixer configured to mix an additive and de-ionized water; and a pipe connecting the mixer to at least one of the rinse arm and the nozzle.

19 Claims, 3 Drawing Sheets

RINSING WAFERS USING COMPOSITION-TUNABLE RINSE WATER IN CHEMICAL MECHANICAL POLISH

TECHNICAL FIELD

This invention relates generally to integrated circuit manufacturing processes, and more particularly to equipment and methods for chemical mechanical polish.

BACKGROUND

Chemical mechanical polish (CMP) is a common practice in the formation of integrated circuits. Typically, CMP is used for the planarization of semiconductor wafers. CMP takes advantage of the synergetic effect of both physical and chemical forces for polishing of wafers. It is performed by applying a load force to the back of a wafer while the wafer rests on a polish pad. Both the polish pad and the wafer are counter-rotated while a slurry containing both abrasives and reactive chemicals is passed underneath. CMP is an effective way to achieve truly global planarization over the entire wafer.

CMP processes typically involve various rinse steps. Conventionally, polish pads and wafers were rinsed with de-ionized (DI) water. The advantageous feature of the DI water is that there will be no undesirable particles left on wafers or polish pads. However, the conventional rinse method using DI water also suffers from drawbacks. First, DI water cannot thoroughly remove the by-products of the CMP, thus a considerable amount of residues was found to be left on wafers after rinsing. Particularly, organic residues are hard to remove even if additional cleaning solutions are used.

Second, DI water, due to its property of lacking ions, has a low conductivity, and thus cannot release the static electricity charges generated in the polishing and the cleaning steps. This results in serious metal line galvanic corrosion by charge transfer. Particularly, significant galvanic corrosions were found in copper lines and other metal features.

Third, with a considerable amount of particles remaining on the polish pads, the lifetime of the polish pads is shortened, resulting in increased CMP cost. In addition, the lifetimes vary significantly from pad to pad, causing difficulty in the monitoring of the polish pads. Accordingly, what is needed in the art is a new rinse method capable of cleaning wafers and polish pads more thoroughly.

SUMMARY OF THE INVENTION

In accordance with one aspect of the present invention, a method for manufacturing integrated circuits on a wafer includes polishing the wafer; and rinsing the wafer using an acidic solution including carbonic acid.

In accordance with another aspect of the present invention, a method for manufacturing integrated circuits on a wafer includes attaching the wafer on a polish head, wherein the polish head is placed over a polish pad; dispensing a slurry onto the polish pad; polishing the wafer; after the step of polishing the wafer, performing a rinsing on the wafer using a composition-tunable rinse water (CTRW) having a pH value not equal to 7; removing the wafer from the polish head; and post-polish cleaning the wafer.

In accordance with yet another aspect of the present invention, a method for manufacturing integrated circuits on a wafer includes attaching the wafer on a polish head; dispensing a slurry onto a polish pad; polishing the wafer using the polish pad; dissolving a carbon oxide gas selected from the group consisting essentially of carbon dioxide and carbon monoxide, and combinations thereof into de-ionized water to generate a solution, wherein the solution has a conductivity of greater than about 1 $\mu$S/cm; after the step of polishing the wafer, performing a rinsing on the wafer using the solution; removing the wafer from the polish head; and post-polish cleaning the wafer.

In accordance with yet another aspect of the present invention, an apparatus for manufacturing integrated circuits on a wafer includes a polish pad; a rinse arm movable over the polish pad; and a post-polish cleaner. The post-polish cleaner includes a brush for brushing the wafer; and a nozzle aiming at the wafer. The apparatus further includes a mixer configured to mix an additive and de-ionized water; and a pipe connecting the mixer to at least one of the rinse arm and the nozzle.

In accordance with yet another aspect of the present invention, an apparatus for manufacturing integrated circuits on a wafer includes a polish pad; a rinse arm over the polish pad; a pipe connected to the rinse arm; and a mixer configured to mix a carbon oxide gas and de-ionized water. The mixer includes a gas inlet; a liquid inlet; and an output connected to the pipe. The apparatus further includes at least one of a conductivity meter and a pH meter connected to the pipe.

In accordance with yet another aspect of the present invention, an apparatus for manufacturing integrated circuits on a wafer includes a polish pad and a post-polish cleaner. The polish cleaner includes a brush for brushing the wafer; and a nozzle aiming at the wafer. The apparatus further includes a pipe connected to the nozzle; and a mixer configured to mix a carbon dioxide gas and de-ionized water. The mixer includes a gas inlet; a liquid inlet; and an output connected to the pipe. The apparatus further includes at least one of a conductivity meter and a pH meter connected to the pipe.

The advantageous features of the present invention include a more efficient rinse and reduced galvanic corrosion occurring on the resulting copper line.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Among the plurality of process steps included in a chemical mechanical polish (CMP) process, two steps are typically included. One of the steps involves the polishing of wafers, and hence is referred to as a polish body throughout the description. The other step is referred to as post-polish cleaning, which involves the cleaning of the wafer after the polish has been conducted.

The polish body further includes a plurality of steps. An exemplary list of the steps included in the polish body is shown as follows:

Step 1: High-pressure rinse.
Step 2: Slurry pre-flow.
Step 3: Main polish using slurry.
Step 4: Cleaning polish.
Step 5: Post-polish high-pressure rinse.

It is realized that CMPs may include many more steps in addition to the above-listed steps. An embodiment for performing the above-listed steps is discussed with reference to FIG. 1, which illustrates an exemplary CMP system for performing the above-listed steps.

Figure 1:
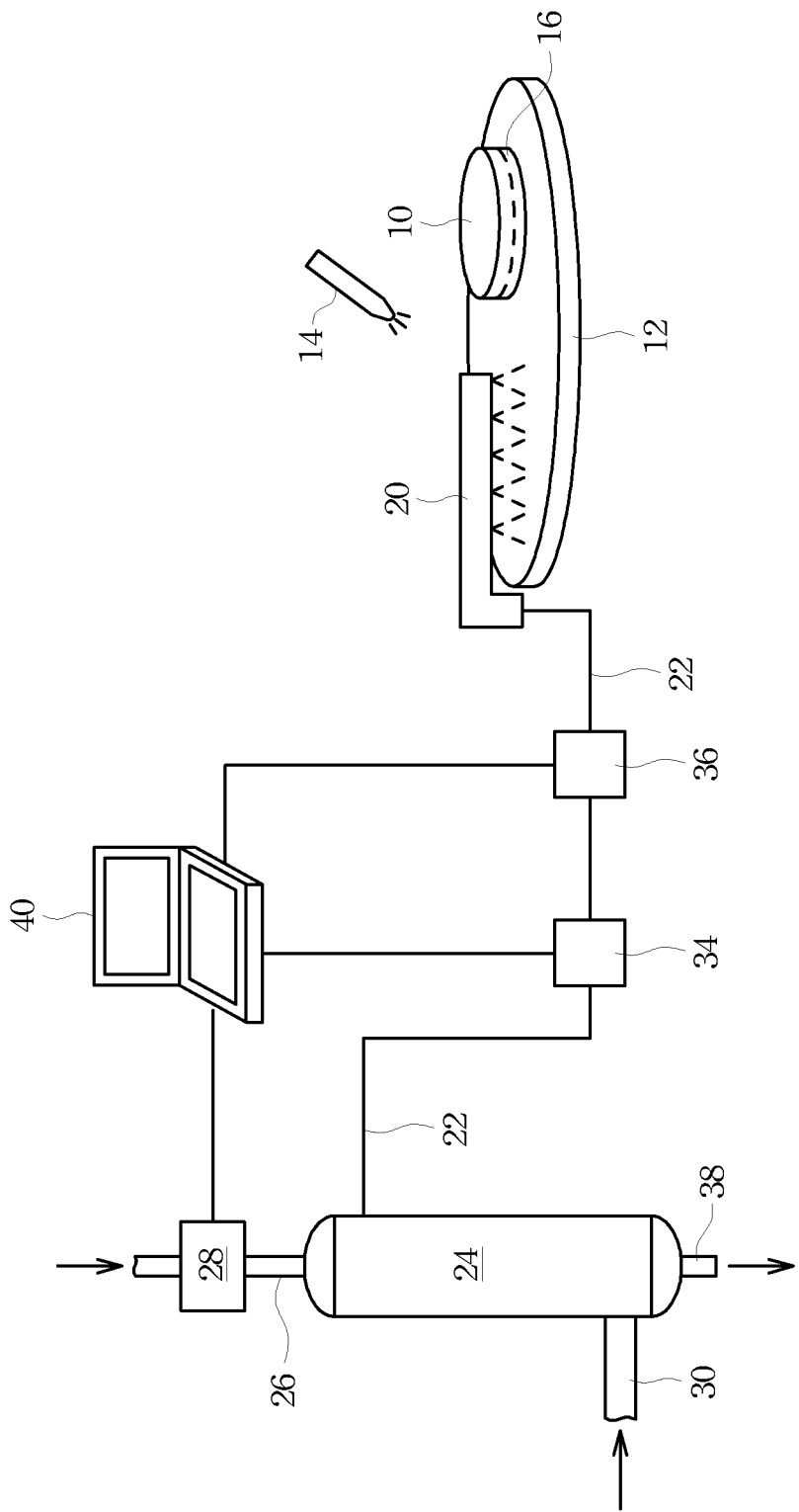
FIG. 1 illustrates a chemical mechanical polish (CMP) system, which includes a mixer for providing composition-tunable rinse water.

Referring to FIG. 1, polish head 10 is placed above polish pad 12. Polish head 10 includes the structures for holding wafer 16, which faces down toward polish pad 12. Polish pad 12 and polish head 10 may counter-rotate during, before and/or after the polishing of wafer 16. The CMP system further includes high-pressure rinse arm 20, which is used to spray composition-tunable rinse water (CTRW), as will be discussed in detail in subsequent paragraphs. High-pressure rinse arm 20 may be moved to be over polish pad 12 during the rinse steps, and moved to not be over polish pad 12 when no rinse steps are performed.

Through pipe 22, high-pressure rinse arm 20 is connected to mixer 24. In an embodiment of the present invention, mixer 24 is used to generate the CTRW for rinsing the wafers. The CTRW may include carbonic acid, which is generated by dissolving gaseous carbon dioxide ($CO_2$) and/or carbon monoxide (CO) into de-ionized (DI) water. Accordingly, mixer 24 includes inlet 26 for introducing carbon oxide, and inlet 30 for introducing DI water. The CMP system may further include gas regulator 28 for regulating the pressure in mixer 24, and/or the flow rate of carbon oxide gas. Mixer 24 may further include drain 38 for balancing the pressure inside mixer 24, and for keeping the CTRW in mixer 24 refreshed. In the following discussion, carbon dioxide is used as an example to explain the concept of the present invention.

When carbon dioxide is dissolved in DI water, carbonic acid is generated ($CO_2+H_2O=>H_2CO_3$), resulting in the reduction in the pH value of the resulting CTRW. The pH value of the resulting CTRW may be adjusted by adjusting the amount of carbon dioxide in the DI water (hence the name "composition-tunable rinse water"), which may be performed, for example, by adjusting the pressure in mixer 24, which pressure is greater than one atmosphere. To monitor the pH value and the conductivity of the CTRW, the CMP system may further include conductivity meter 34 and pH meter 36 connected between mixer 24 and high-pressure rinse arm 20. The values measured by conductivity meter 34 and pH meter 36 may be fed back to control unit 40, which monitors the measured conductivity and pH value of the CTRW, and compares the measurement results with desirable values. If the measured conductivity and the value deviate from the desirable values, control unit 40 controls gas regulator 28 to adjust the flow rate and/or the pressure of carbon oxide, until the conductivity and the pH value in pipe 22 are in the desirable ranges. Accordingly, the CTRW sprayed on polish pad 12 has a tunable conductivity and a tunable pH value.

In alternative embodiments, the CTRW may be generated using DI water and other acidic materials, such as HCOOH, $CH_3COOH$, organic salt such as $CH_3—(CH_2)_x—NH_4Cl$, $NH_4Cl$, or the like, or combinations thereof. The introduction of the acidic materials into DI water results in the pH value of the CTRW being lowered, and the conductivity of the CTRW being increased. Preferably, the conductivity of the CTRW is greater than about 1 μS/cm, and more preferably between about 1 μS/cm and about 15 μS/cm, and the pH value of the CTRW is preferably less than about 6.9, and more preferably between about 3 and about 6.9. When the CTRW is formed of carbon dioxide and DI water, at temperatures between about 0° C. and about 60° C., the preferred carbon dioxide concentration in the CTRW is between about 0.0001 mM and about 0.75 mM.

In yet other embodiments, the CTRW may be generated using DI water and alkaline materials, such as $NH_3$, KOH, organic salt such as $CH_3COONa$, or combinations thereof. The introduction of the alkaline materials into DI water results in the pH value and the conductivity of the CTRW being increased over that of pure DI water. Again preferably, the conductivity of the CTRW is between about 1 μS/cm and about 15 μS/cm, and the pH value of the alkaline CTRW is preferably greater than about 7.1.

To adjust the conductivity and the values, the mixer 24, as shown in FIG. 1, is preferably located close to high-pressure rinse arm 20, particularly if the CTRW is formed by mixing gaseous materials with DI water. Advantageously, since carbon oxide gases have a low solubility in water, and may readily be evaporated from water, in-situ using the CTRW immediately after its mixing ensures the value and conductivity to be inside the desirable ranges. If the CTRW is formed by dissolving other materials, such as liquid or solid materials, different mixers may be used, or the CTRW may be pre-mixed and transported to where the rinse occurs.

The CTRW generated using the above-discussed methods and equipment may be used in various steps in the CMP. An exemplary CMP process is discussed as below with reference to FIG. 1 and the above-listed exemplary steps in the rinse body. First, wafer 16 is attached on polish head 10. A high-pressure rinse (step 1) is performed by moving the high-pressure rinse arm 20 over polish pad 12, and spraying the CTRW onto polish pad 12. In the meantime, wafer 16 stays above polish pad 12, and hence is not rinsed. Preferably, step 1 comprises no rinse steps using pure DI water. After step 1, high-pressure rinse arm 20 is moved to not be over polish pad 12.

Next, the slurry used for the polish is pre-flowed (step 2) to discard the slurry in slurry nozzle 14, and in the pipes of the slurry dispensing system. The main polish (step 3) is then performed by dispensing the slurry onto the polish pad 12, and counter-rotating polish head 10 and polish pad 12.

After the main polish, a cleaning polish (step 4) is performed, wherein wafer 16 remains over, and possibly contacting, polish pad 12, and may continue to rotate. High-pressure rinse arm 20 is moved over polish pad 12 again, and sprays the CTRW on the rotating polish pad 12. The slurry and the substances generated by the main polish are thus removed, and polish pad 12 is cleaned.

Next, in the post-polish high pressure rinse (step 5), wafer 16 is removed from polish head 10. High-pressure rinse arm 20 is used to continue to rinse polish pad 12, but not wafer 16, using the CTRW. In the meantime, polish pad 12 may continue to rotate.

Figure 2:
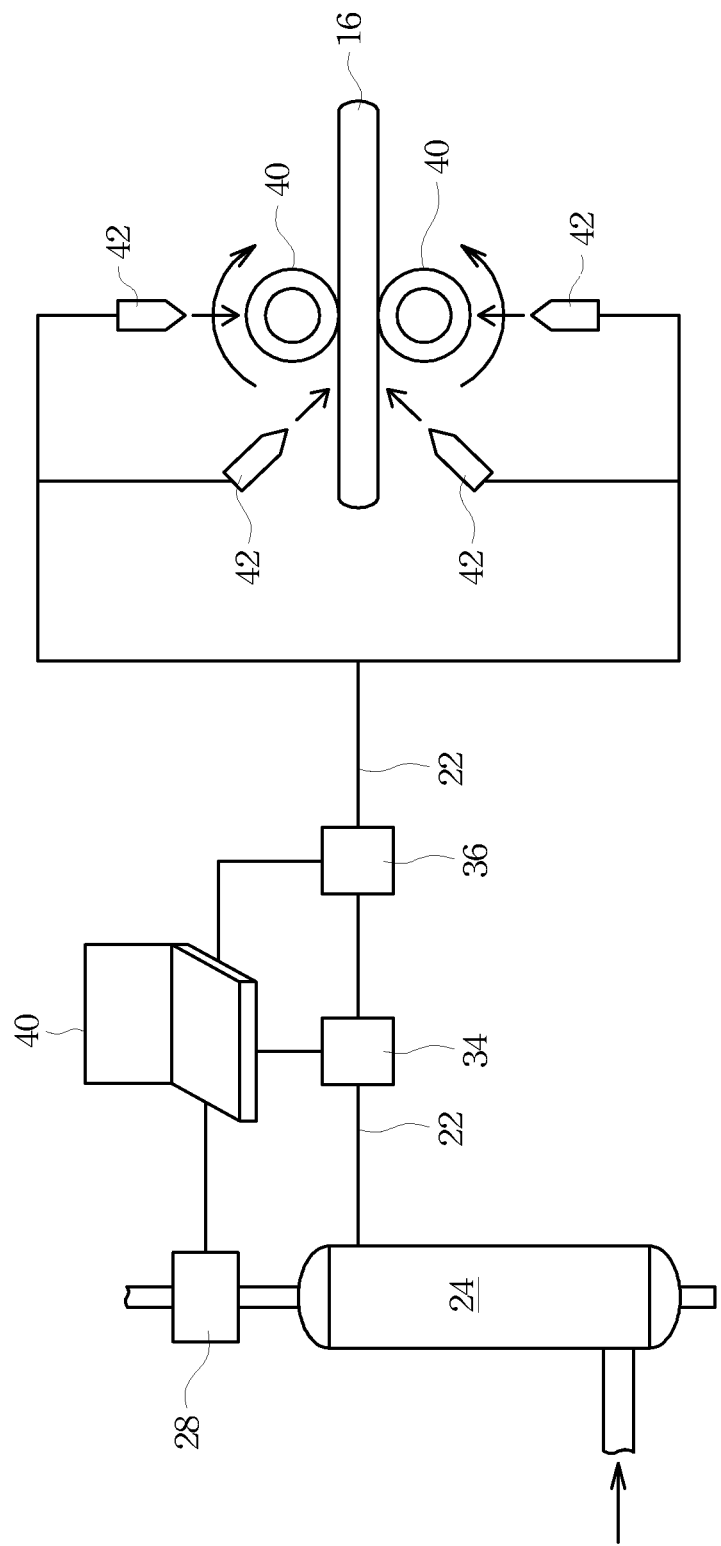
FIG. 2 illustrates a post-polish cleaner in the CMP system, wherein the post-polish cleaner includes a mixer for providing the composition-tunable rinse water.

After steps 1 through 5 in the polish body are performed, wafer 16 undergoes a post-polish cleaning step. An exemplary post-polish cleaner is shown in FIG. 2, which shows wafer 16 scribed (also referred to as brushed) by brushes, which may be, for example, roll sponges 44. Roll sponges 44 rotate to brush the remaining particles, slurries, or other substances off wafer 16. In the meantime, the CTRW is sprayed onto wafer 16 and sponges 44, for example, using nozzles 42, wherein some nozzles 42 may aim at wafer 16, and some nozzles may aim at roll sponges 44. Nozzles 42 may be connected to a same mixer 24 for the polish body, or a separate mixer 24. With separate mixers 24 used for the polish body and the post-polish cleaning, the compositions of the CTRWs for the polish body and the post-polish cleaning may be different.

Various rinse steps may be combined with the post-polish cleaning using the CTRW. In an embodiment, before the above-discussed post-polish clean step, an acidic solution, such as citric acid, may be used to pre-clean wafer 16. In other embodiments, no acid pre-clean is performed. In yet other embodiments, after the post-polish clean step using the CTRW, a rinse using pure DI water may be performed, with the roll sponges 44 continuing to brush wafer 16. In yet other embodiments, after the post-polish clean step using the CTRW, no further rinse using pure DI water is performed.

It is realized that the composition of the CTRW may be real-time adjusted. This provides advantageous features to the above-discussed rinse steps (for example, step 1 and step 4) and the post-polish clean step. For example, throughout all above-discussed rinse and post-polish clean steps, the CTRW may have a constant composition. Alternatively, each of the above-discussed rinse and post-polish clean steps may use a CTRW having a different composition than the CTRWs used in other steps. Even in a same step, the composition of the CTRW may change from time to time, even if the CTRWs with different compositions may all be made of the same materials, such as carbon dioxide and DI water, and by the same mixer 24. For example, in the initial stage of the post-polish clean step (or in either of the steps 1 or 4), the CTRW may have a higher conductivity and a lower pH value (lower than 7), while in later stages of the post-polish clean step (or in either of the steps 1 or 4), the CTRW may have a lower conductivity and a higher value (higher than 7). Advantageously, such change in compositions does not need the swapping of equipment, and may be performed seamlessly. For example, the compositions are adjusted by the control unit 40, which controls gas regulator 28 to change the compositions (for example, the concentration of carbon oxide) to different values.

Further, for certain stages of the rinse steps and/or the post-polish clean step, for example, the final stages of the post-polish clean stage, the mixer 24 may even output pure DI water without mixing substantially any carbon dioxide in the DI water. In addition, one or more of the above-discussed rinse and post-polish clean steps may be performed using pure DI water, while other steps are performed using the CTRW.

Figure 3:
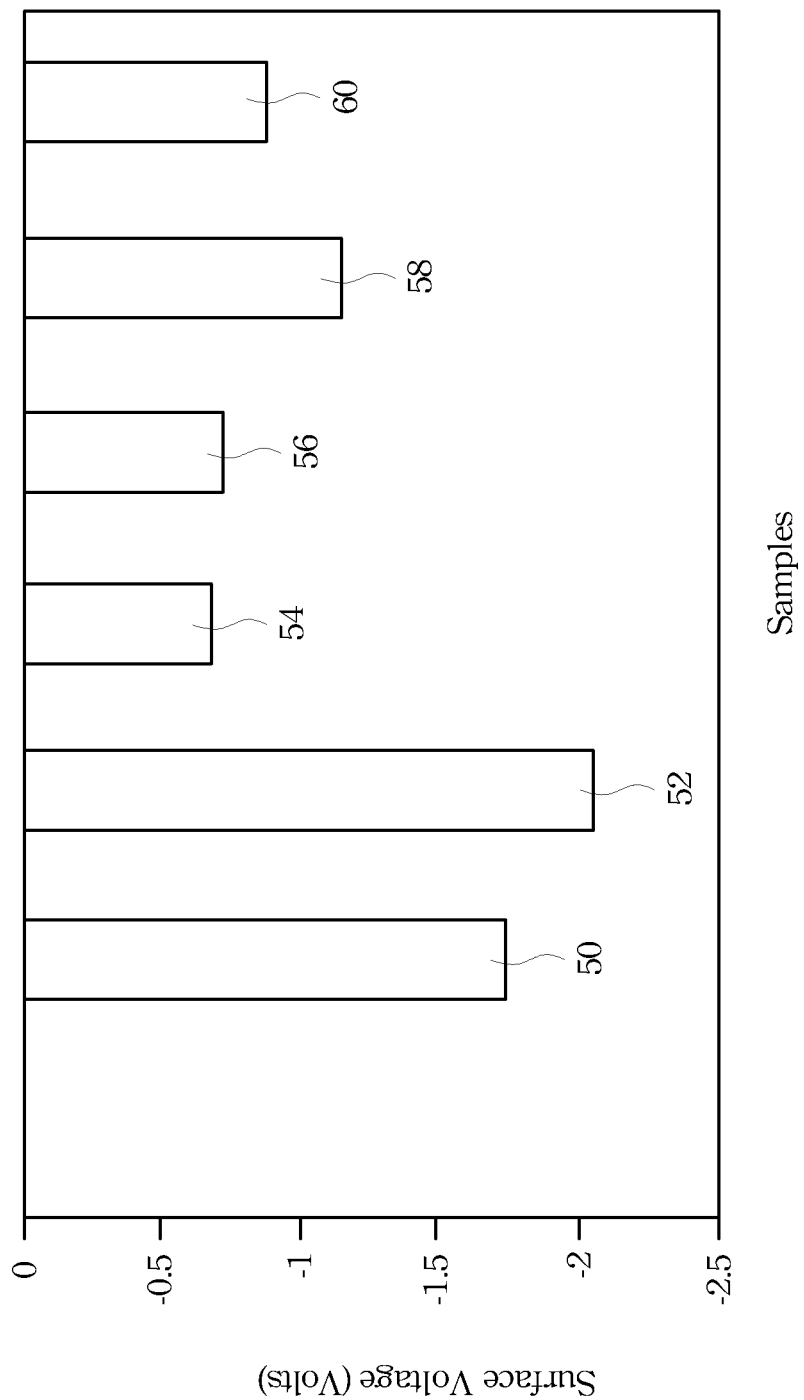
FIG. 3 illustrates surface voltages measured from wafer samples after CMP processes.

Advantageously, with the conductivity of the CTRW increased over the DI water, the charges built-up on wafers during the polishing steps and the post-polishing cleaning may be released more efficiently when the wafers are rinsed by the CTRW. FIG. 3 illustrates experimental results showing the surface voltages caused by the charges generated by the polishing and the post-polishing cleaning steps. The Y-axis indicates the surface voltages measured from the wafers after the post-polishing cleaning, while the X-axis represents different sample wafers. Bars 50 and 52 were measured from sample wafers rinsed using pure DI water, while bars 54, 56, 58, and 60 were measured from wafers rinsed using the CTRW. It is noted that the magnitude of the surface voltages represented by bars 54, 56, 58, and 60 were significantly lower than the surface voltages represented by bars 50 and 52, indicating a reduction of charges caused by the CTRW rinsing. Further experiments revealed that the amount of the surface charges on wafers rinsed by the CTRW may be reduced by more than about 75 percent than that on wafers rinsed by pure DI water.

Experiments have also revealed that the defects in copper lines after the CMP processes are significantly reduced. On sample wafers rinsed using pure DI water, noticeable corrosions were found. While on sample wafers rinsed using the CTRW, no noticeable corrosions were found.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing integrated circuits on a wafer, the method comprising:
   pre-polish cleaning, the pre-polish cleaning comprising:
      introducing de-ionized water into a mixer configured to mix carbon dioxide and the de-ionized water;
      outputting a first solution from the mixer to a conductivity meter or a pH meter, wherein the first solution comprises the carbon dioxide dissolved in the de-ionized water;
      monitoring a first value of the first solution responsive to outputting the first solution from the mixer and adjusting an amount of the carbon dioxide introduced into the mixer in response to detecting a first deviation of the first value from a first desired value;
      monitoring a second value of the first solution responsive to outputting the first solution from the mixer and adjusting a flow rate or pressure of the carbon dioxide introduced into the mixer in response to detecting a second deviation of the second value from a desired second value;
      outputting the first solution from the mixer to a rinse arm; and
      rinsing a polish pad with the first solution;
   polishing the wafer, the polishing comprising:
      dispensing a slurry over the polish pad; and
      polishing the wafer using the slurry; and
   post-polish cleaning, the post-polish cleaning comprising:
      forming a second solution in the mixer;
      outputting the second solution from the mixer to the rinse arm; and
      rinsing the polish pad using the second solution,
   wherein the second solution has a different ratio of deionized water and carbon dioxide than the first solution.

2. The method of claim 1 wherein the post-polish cleaning further comprises:
   rinsing the wafer using the second solution.

3. The method of claim 1, wherein the first solution has a pH value less than about 6.9.

4. The method of claim 1, wherein the first solution has a conductivity value between about 1 μS/cm and about 15 μS/cm.

5. The method of claim 1, wherein the first solution has a carbon dioxide concentration of between about 0.0001 mM and about 0.75 mM.

6. The method of claim 1, wherein monitoring a first value of the first solution comprises monitoring a pH value.

7. The method of claim 1, wherein monitoring a first value of the first solution comprises monitoring conductivity.

8. A method for manufacturing integrated circuits on a wafer, the method comprising:
   attaching the wafer on a polish head, wherein the polish head is placed over a polish pad;
   dispensing a slurry onto the polish pad;
   polishing the wafer;
   introducing de-ionized water into a mixer to mix an acid source material and the de-ionized water to form an acidic composition-tunable rinse water (CTRW);
   outputting the acidic CTRW from the mixer;
   monitoring a first value of the acidic CTRW and adjusting an amount of the acid source material introduced into the mixer in response to detecting a deviation of the first value from a desired value;
   after the step of polishing the wafer, introducing the de-ionized water into the mixer to mix an alkaline source material and the de-ionized water to form an alkaline CTRW having a pH value greater than 7;
   performing a rinsing on the wafer using the alkaline CTRW;
   detaching the wafer from the polish head; and
   post-polish cleaning the wafer.

9. The method of claim 8, wherein a difference between the pH value of the acidic or alkaline CTRW and a pH value of de-ionized (DI) water is greater than about 0.1.

10. The method of claim 8, wherein the acidic or alkaline CTRW has a conductivity value between about 1 μS/cm and about 15 μS/cm.

11. The method of claim 8, wherein between the step of polishing the wafer and the step of detaching the wafer from the polish head, no rinsing using pure DI water is performed.

12. The method of claim 8 further comprising, before the step of dispensing the slurry onto the polish pad, performing an additional rinsing on the wafer using the acidic CTRW.

13. The method of claim 8, wherein the step of post-polish cleaning the wafer comprises performing an additional rinsing the wafer using the acidic CTRW.

14. The method of claim 13, wherein during the step of post-polish cleaning, no rinsing step using pure DI water is performed on the wafer.

15. The method of claim 8, wherein the acid source material is carbon dioxide.

16. The method of claim 8, wherein the acid source material is selected from the group consisting of HCOOH, $CH_3COOH$, $CH_3—(CH_2)_x—NH_4Cl$, $NH_4Cl$, and combinations thereof.

17. A method for manufacturing integrated circuits on a wafer, the method comprising:
   forming an acidic composition-tunable rinse water (CTRW), the forming comprising:
      introducing de-ionized water into a mixer;
      introducing an acid source material into the mixer to form the acidic CTRW;
      outputting the acidic CTRW to a rinse arm;
   rinsing a polish pad with the acidic CTRW;
   polishing the wafer using a slurry;
   forming an alkaline CTRW, the forming comprising:
      introducing de-ionized water into the mixer;
      introducing an alkaline source material into the mixer to form the alkaline CTRW; and
      outputting the alkaline CTRW to the rinse arm; and
   after polishing the wafer, rinsing the polish pad using the alkaline CTRW.

18. The method of claim 17, wherein the forming the acidic CTRW further comprises monitoring a first value of the pH or the conductivity of the acidic CTRW.

19. The method of claim 17, wherein the forming the alkaline CTRW further comprises monitoring a first value of the pH or the conductivity of the alkaline CTRW.

* * * * *